(12) United States Patent
Jung et al.

(10) Patent No.: US 11,293,097 B2
(45) Date of Patent: Apr. 5, 2022

(54) APPARATUS FOR DISTRIBUTING GAS AND APPARATUS FOR PROCESSING SUBSTRATE INCLUDING THE SAME

(71) Applicant: JUSUNG ENGINEERING CO., LTD., Gwangju-si (KR)

(72) Inventors: Suk Chul Jung, Gwangju-si (KR); Young-Rok Kim, Gwangju-si (KR); Jong Kuk Han, Gwangju-si (KR)

(73) Assignee: JUSUNG ENGINEERING CO., LTD.

( * ) Notice: Subject to any disclaimer, the term of this patent is extended or adjusted under 35 U.S.C. 154(b) by 238 days.

(21) Appl. No.: 16/593,931

(22) Filed: Oct. 4, 2019

(65) Prior Publication Data

US 2020/0032393 A1     Jan. 30, 2020

Related U.S. Application Data

(62) Division of application No. 15/301,717, filed as application No. PCT/KR2015/003343 on Apr. 3, 2015, now abandoned.

(30) Foreign Application Priority Data

Apr. 11, 2014   (KR) .................. 10-2014-0043632

(51) Int. Cl.
   *C23C 16/455*   (2006.01)
   *C23C 16/458*   (2006.01)

(52) U.S. Cl.
   CPC .......... *C23C 16/455* (2013.01); *C23C 16/458* (2013.01); *C23C 16/45563* (2013.01); *C23C 16/45565* (2013.01); *C23C 16/45574* (2013.01)

(58) Field of Classification Search
   CPC ............ C23C 16/455; C23C 16/45565; C23C 16/45563; C23C 16/45574; C23C 16/458; C23C 16/45578
   See application file for complete search history.

(56) References Cited

U.S. PATENT DOCUMENTS 4,096,822 A    6/1978  Yamawaki et al.
5,314,570 A *  5/1994  Ikegaya ................. C23C 16/27
                                                117/103

(Continued)

FOREIGN PATENT DOCUMENTS

CN    102473610 A    5/2012
JP    H0555150 A     3/1993

(Continued)

*Primary Examiner* — Jeffrie R Lund
(74) *Attorney, Agent, or Firm* — Renaissance IP Law Group LLP

(57) ABSTRACT

Disclosed is an apparatus for distributing gas which is capable of uniformly injecting processing gas into a plurality of gas passages being communicated with a plurality of gas distribution holes, and an apparatus for processing substrate including the same, wherein the apparatus for distributing gas may include a body including a plurality of gas passages connected with a plurality of gas distribution holes for distributing processing gas; and at least one gas injection module connected with at least one lateral surface of the body and respectively communicated with the plurality of gas passages, wherein the gas injection module firstly buffers the processing gas supplied from the external, secondly buffers the firstly buffered processing gas, and injects the buffered processing gas into the plurality of gas passages.

6 Claims, 10 Drawing Sheets

(56) References Cited

U.S. PATENT DOCUMENTS

| | | | |
|---|---|---|---|
| 5,551,982 A | 9/1996 | Anderson et al. | |
| 5,599,397 A | 2/1997 | Anderson et al. | |
| 5,725,673 A | 3/1998 | Anderson et al. | |
| 5,916,369 A | 6/1999 | Anderson et al. | |
| 6,007,633 A | 12/1999 | Kitamura et al. | |
| 6,015,590 A * | 1/2000 | Suntola | C23C 16/45527 427/255.23 |
| 6,189,485 B1 | 2/2001 | Matsuda et al. | |
| 6,486,081 B1 | 11/2002 | Ishikawa et al. | |
| 6,630,030 B1 * | 10/2003 | Suntola | C23C 16/45565 118/728 |
| 8,486,191 B2 * | 7/2013 | Aggarwal | C23C 16/04 118/715 |
| 8,771,418 B2 | 7/2014 | Je et al. | |
| 9,624,603 B2 * | 4/2017 | Yamada | C30B 25/14 |
| 9,803,282 B2 * | 10/2017 | Yamada | C30B 25/165 |
| 10,947,640 B1 * | 3/2021 | Ravi | C23C 16/455 |
| 2008/0152803 A1 * | 6/2008 | Lamouroux | C23C 16/45578 427/248.1 |
| 2010/0092697 A1 * | 4/2010 | Poppe | C30B 25/105 427/585 |
| 2010/0255658 A1 * | 10/2010 | Aggarwal | C23C 16/45504 438/478 |
| 2012/0141676 A1 * | 6/2012 | Sershen | C23C 16/453 427/255.23 |
| 2013/0032084 A1 * | 2/2013 | Sivaramakrishnan | C30B 25/20 117/102 |
| 2014/0174362 A1 | 6/2014 | Kao et al. | |
| 2014/0209015 A1 * | 7/2014 | Yamada | C23C 16/45574 117/98 |
| 2014/0216577 A1 | 8/2014 | Huang et al. | |
| 2014/0273409 A1 * | 9/2014 | Pitney | C23C 16/45585 438/478 |
| 2014/0273410 A1 * | 9/2014 | Abedijaberi | C23C 16/45561 438/478 |
| 2014/0273503 A1 * | 9/2014 | Pitney | C23C 16/45563 438/758 |
| 2014/0284404 A1 | 9/2014 | Kuah et al. | |
| 2014/0366803 A1 * | 12/2014 | Yamada | C30B 25/14 118/713 |
| 2014/0370691 A1 * | 12/2014 | Yamada | C23C 16/303 438/478 |
| 2015/0011077 A1 * | 1/2015 | Yamada | H01L 21/0254 438/478 |
| 2015/0013594 A1 * | 1/2015 | Yamada | C30B 25/14 117/102 |
| 2015/0093883 A1 | 4/2015 | Moriyama et al. | |
| 2015/0361555 A1 * | 12/2015 | Sivaramakrishnan | C23C 16/45512 427/255.28 |
| 2017/0121815 A1 | 5/2017 | Jung et al. | |
| 2017/0283985 A1 * | 10/2017 | Takahashi | C23C 16/455 |
| 2020/0032393 A1 * | 1/2020 | Jung | C23C 16/45574 |

FOREIGN PATENT DOCUMENTS

| | | |
|---|---|---|
| JP | 2011222592 A | 11/2011 |
| KR | 100824418 B1 | 4/2008 |
| KR | 20100060086 A | 6/2010 |
| KR | 20110004575 A | 1/2011 |

* cited by examiner

III-III'

APPARATUS FOR DISTRIBUTING GAS AND APPARATUS FOR PROCESSING SUBSTRATE INCLUDING THE SAME

TECHNICAL FIELD

The present invention relates to an apparatus for distributing gas and an apparatus for processing substrate including the same.

BACKGROUND ART

Generally, in order to manufacture a solar cell, a semiconductor device and a flat panel display device, it is necessary to form a predetermined thin film layer on a surface of a substrate. Thus, a semiconductor manufacturing process may be carried out, for example, a thin film deposition process of depositing a thin film of a predetermined material on the substrate, a photo process of selectively exposing the thin film by the use of photosensitive material, and an etching process of forming a pattern by selectively removing an exposed portion of the thin film.

The semiconductor manufacturing process is performed inside a substrate processing apparatus designed to be suitable for optimal circumstances. Recently, a substrate processing apparatus using plasma is generally used to carry out a deposition or etching process.

This semiconductor manufacturing process using plasma may be a PECVD (Plasma Enhanced Chemical Vapor Deposition) apparatus, wherein the PECVD apparatus may use a gas distribution apparatus for introducing gas into the inside of a chamber.

The gas distribution apparatus is provided to distribute various processing gases onto the surface of the substrate through a plurality of gas distribution holes formed in a plate-shaped body. Generally, the gas distribution apparatus may be formed of aluminum in consideration of workability and reactivity on the processing gas.

As shown in FIG. 1, a related art gas distribution apparatus may include a plate-shaped body 10, a plurality of gas passages 20 which are provided by forming a plurality of holes along a predetermined direction of the body 10 at fixed intervals inside the body 10 by a machinery working using a drill and sealing both ends of each hole by welding 22, and a plurality of gas distribution holes 30 which are respectively connected with the plurality of gas passages 20 and are formed vertically to a lower surface of the body 10. In this related art gas distribution apparatus, processing gas, which is injected into the center of each of the plurality of gas passages 20 through a gas supply pipe 40, is downwardly distributed through the plurality of gas distribution holes 30.

In case of the related art gas distribution apparatus, the processing gas is injected into each of the plurality of gas passages 20, whereby it is difficult to realize uniformity on injection of the processing gas into the plurality of gas passages 20. Also, both ends of each of the plurality of gas passages 20 are permanently sealed by welding, whereby it is difficult to clean the gas passages 20 and the gas distribution holes 30.

DISCLOSURE

Technical Problem

Accordingly, the present invention is directed to an apparatus for distributing gas and an apparatus for processing substrate including the same that substantially obviates one or more problems due to limitations and disadvantages of the related art.

An aspect of the present invention is to provide an apparatus for distributing gas and an apparatus for processing substrate including the same, which is capable of uniformly injecting processing gas into a plurality of gas passages being communicated with a plurality of gas distribution holes.

Another aspect of the present invention is to provide an apparatus for distributing gas and an apparatus for processing substrate including the same, which facilitates to clean a plurality of gas distribution holes and a plurality of gas passages.

Additional advantages and features of the invention will be set forth in part in the description which follows and in part will become apparent to those having ordinary skill in the art upon examination of the following or may be learned from practice of the invention.

Technical Solution

To achieve these and other advantages and in accordance with the purpose of the invention, as embodied and broadly described herein, there is provided an apparatus for distributing gas that may include a body including a plurality of gas passages connected with a plurality of gas distribution holes for distributing processing gas; and at least one gas injection module connected with at least one lateral surface of the body and respectively communicated with the plurality of gas passages, wherein the gas injection module includes a first gas buffering space for firstly buffering the processing gas supplied from the external; and a second gas buffering space for secondly buffering the processing gas firstly buffered in the first gas buffering space, and injecting the secondly buffered processing gas into the plurality of gas passages.

In another aspect of the present invention, there is provided an apparatus for processing substrate that may include a processing chamber; a chamber lid for covering an upper side of the processing chamber; a substrate supporting means for supporting a substrate, the substrate supporting means provided inside the processing chamber; and a gas distribution means confronting the substrate supporting means, the gas distribution means connected with a lower surface of the chamber lid, wherein the gas distribution means includes the above apparatus for distributing gas.

Advantageous Effect

According to the present invention, the processing gas is uniformly injected into the plurality of gas passages so that it is possible to easily clean the plurality of gas passages and the plurality of gas distribution holes. Also, the processing gas is uniformly distributed onto the surface of the substrate, which enables the uniform substrate processing.

MODE FOR INVENTION

On explanation about the embodiments of the present invention, the following details about the terms should be understood.

The term of a singular expression should be understood to include a multiple expression as well as the singular expression if there is no specific definition in the context. If using the term such as "the first" or "the second", it is to separate any one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of the two or more elements selected from the first, second and third elements as well as each element of the first, second and third elements. Also, if it is mentioned that a first element is positioned "on or above" a second structure, it should be understood that the first and second elements may be brought into contact with each other, or a third element may be interposed between the first and second elements.

Hereinafter, an apparatus for distributing gas (hereinafter, referred to as 'gas distribution apparatus') according to the present invention and an apparatus for processing substrate including the same will be described with reference to the accompanying drawings.

Figure 1:
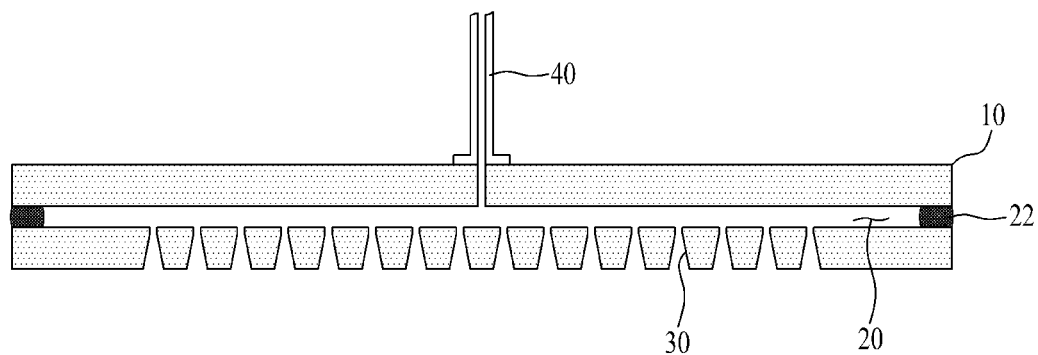
FIG. 1 is a cross sectional view illustrating a related art gas distribution apparatus.
Figure 2:
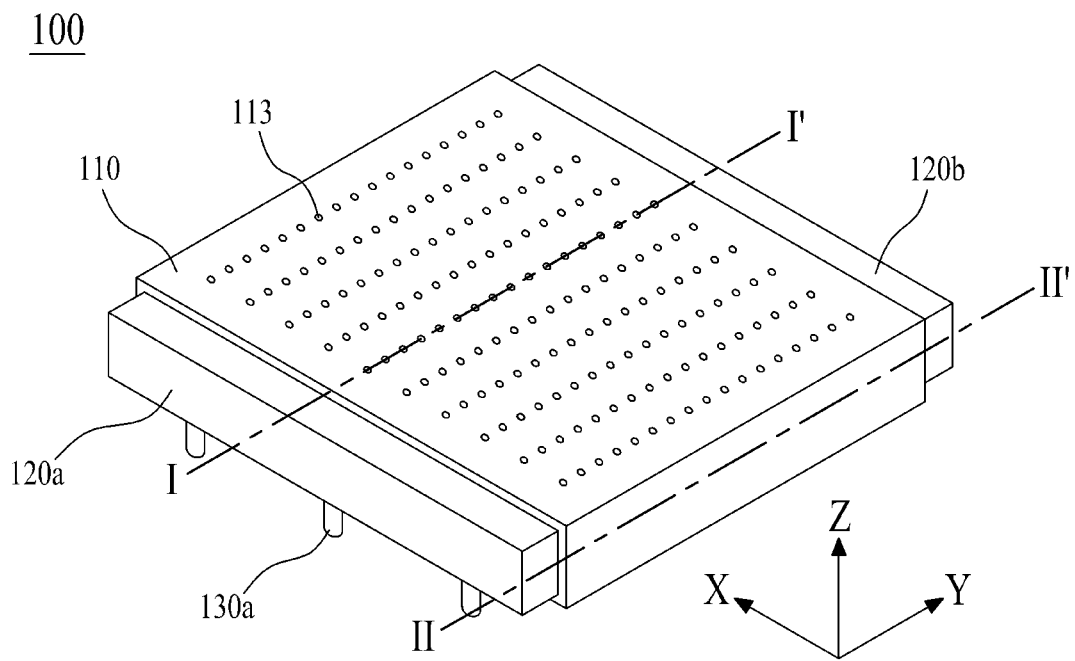
FIG. 2 is a rear perspective view illustrating an apparatus for distributing gas according to the first embodiment of the present invention.
Figure 3:
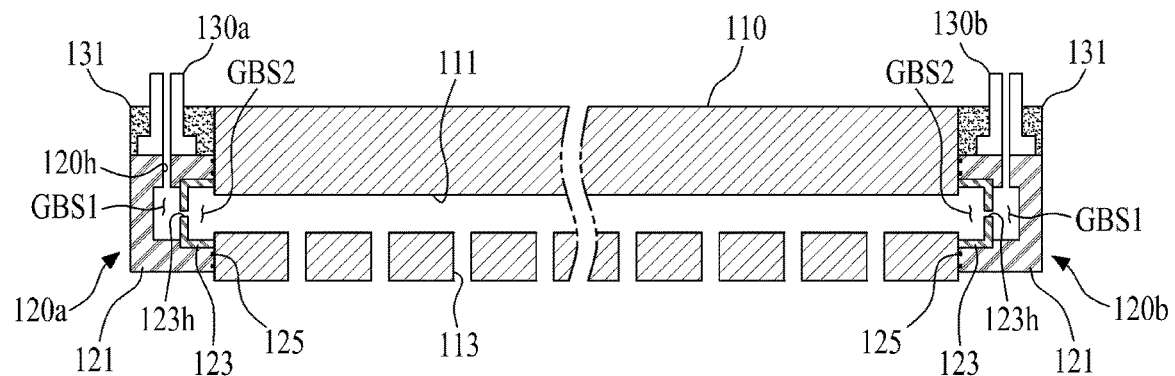
FIG. 3 is a vertical cross sectional view along I-I' of FIG. 2.
Figure 4:
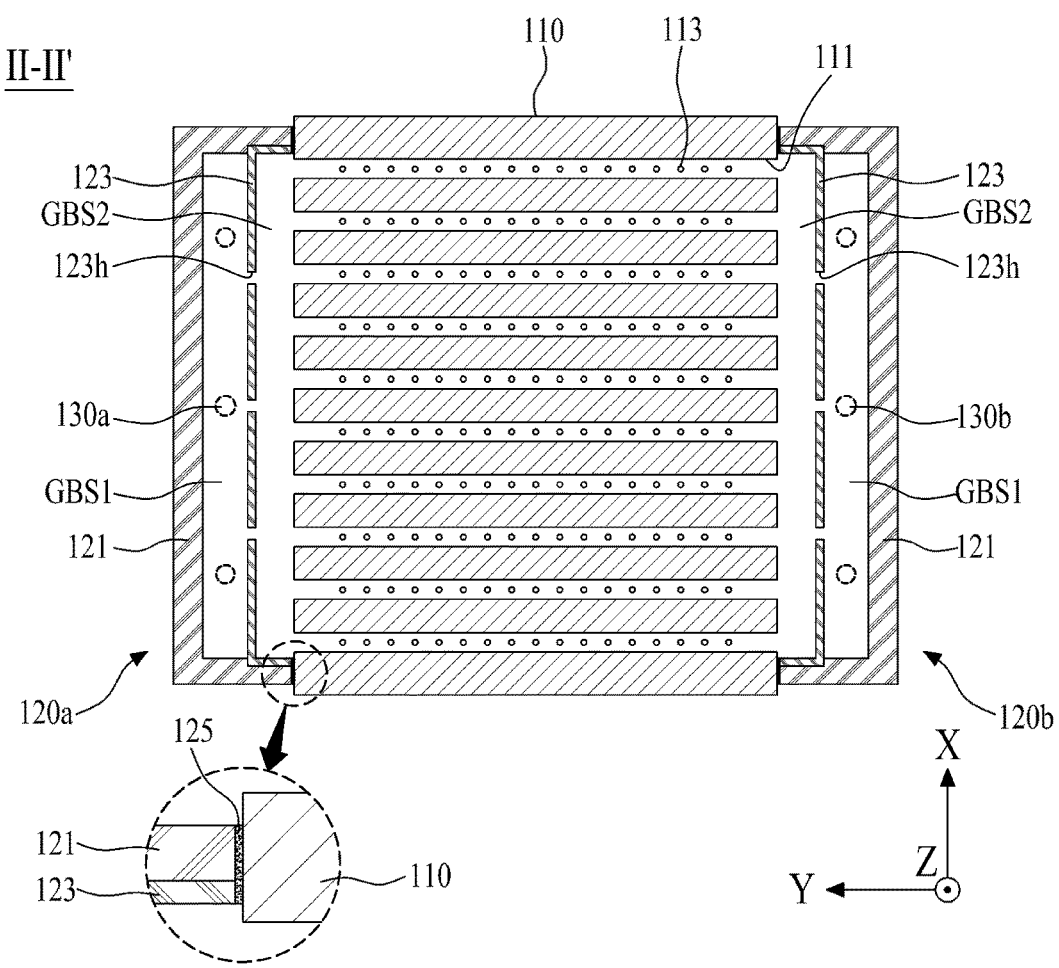
FIG. 4 is a horizontal cross sectional view along II-II' of FIG. 2.

FIG. 2 is a rear perspective view illustrating a gas distribution apparatus according to the first embodiment of the present invention, FIG. 3 is a vertical cross sectional view along I-I' of FIG. 2, and FIG. 4 is a horizontal cross sectional view along II-II' of FIG. 2.

Referring to FIGS. 2 to 4, the gas distribution apparatus 100 according to the first embodiment of the present invention may include a body 110, a first gas injection module 120a, and a second gas injection module 120b.

The body 110 may be formed of a plate-shaped metal material with a predetermined thickness, for example, aluminum or aluminum alloy. The body 110 is detachably provided in a lower surface of a chamber lid for covering an upper side of a processing chamber (not shown), whereby the body 110 confronts a substrate supporting means (not shown) provided on a bottom surface of the processing chamber.

The body 110 is provided with a plurality of gas passages 111 and a plurality of gas distribution holes 113.

The plurality of gas passages 111 are provided at fixed intervals in parallel to a horizontal direction (X) or vertical direction (Y) inside the body 110. For example, the plurality of gas passages 111 may be provided by forming a plurality of holes penetrating the body 110 from its one surface to the other surface through a gun drilling working. Herein, processing gas is injected into the plurality of gas passages 111 from the first and second gas injection modules 120a and 120b.

The plurality of gas distribution holes 113 are vertically formed on a rear surface of the body 110 at fixed intervals, and are communicated with the plurality of gas passages 111, respectively. The plurality of gas distribution holes 113 downwardly distribute the processing gas, which is injected into the plurality of gas passages 111, at a constant pressure. The plurality of gas distribution holes 113 may include at least one distribution nozzle to be optimized for at least one among a distribution area of the processing gas, a distribution angle of the processing gas, and a distribution amount of the processing gas.

Each of the plurality of gas distribution holes 113 according to one embodiment of the present invention may be formed in a cylinder shape whose diameter is smaller than that of the gas passage 111.

Although not shown, each of the plurality of gas distribution holes 113 according to another embodiment of the present invention may be formed of a funnel shape with a first distribution part having a first diameter in communication with the gas passage 111, and a second distribution part in communication with the first distribution part, wherein a diameter of the second distribution part is gradually increased from the first distribution part having the first diameter to the rear surface of the body 110.

Although not shown, each of the plurality of gas distribution holes 113 according to another embodiment of the present invention may be formed of a predetermined shape with a first distribution part having a first diameter in communication with the gas passage 111, a second distribution part having a second diameter being smaller than the first diameter in communication with the first distribution part, and a third distribution part in communication with the second distribution part, wherein a diameter of the third distribution part is gradually increased from the second distribution part having the second diameter to the rear surface of the body 110.

The first gas injection module 120a is connected with one lateral surface of the body 110, wherein the first gas injection module 120a injects the processing gas supplied through at least one of first gas supply pipe 130a to each of the plurality of gas passages 111. The first gas injection module 120a according to one embodiment of the present invention may include a first gas buffering space (GBS1) for firstly buffering the processing gas supplied from the first gas supply pipe 130a, and a second gas buffering space (GBS2) for secondly buffering the processing gas supplied from the first gas buffering space (GBS1) and injecting the buffered processing gas into one side of each of the plurality of gas passages 111. For example, the first gas injection module 120a may include a first gas buffering member 121 having the first gas buffering space (GBS1), and a second gas buffering member 123 having the second gas buffering space (GBS2).

The first gas buffering member 121 includes the first gas buffering space (GBS1) for firstly buffering the processing gas supplied through the first gas supply pipe 130a, and the first gas buffering member 121 is connected with one lateral surface of the body 110 so as to cover one side of each of the plurality of gas passages 111. For example, the first gas buffering member 121 may be formed in a case shape whose inner lateral surface facing toward the plurality of gas passages 111 is opened so as to include the first gas buffering space (GBS1) surrounded by an outer lateral surface and each lateral sidewall being vertical to the outer lateral surface. Accordingly, the first gas buffering member 121 firstly buffers or diffuses the processing gas supplied through the first gas supply pipe 130a in the first gas buffering space (GBS1).

A gas supply hole 120h being in communication with the first gas supply pipe 130a is formed in a lateral surface of the first gas buffering member 121, for example, an upper lateral surface of the first gas buffering member 121. In this case, a sealing member may be provided between the upper lateral surface of the first gas buffering member 121 and the first gas supply pipe 130a. In addition, a connection part between the first gas supply pipe 130a and the gas supply hole 120h may be sealed by a sealing jacket 131. Herein, the first gas buffering member 121 may be provided with the two or more first gas supply pipes 130a. In this case, the two or more first gas supply pipes 130a may be individually connected with a gas supply means (not shown), or may be diverged from a main supply pipe connected with the gas supply means (not shown).

A sealing member 125 is provided between each sidewall of the first gas buffering member 121 and one lateral surface of the body 110. The sealing member 125 may be an O-ring or pad, wherein the O-ring or pad may be formed of a material which is not damaged by the processing gas.

The second gas buffering member 123 includes the second gas buffering space (GBS2) for secondly buffering the processing gas which is firstly buffered in the first gas buffering space (GBS1) of the first gas buffering member 121, and injecting the secondly-buffered processing gas into the plurality of gas passages 111. Also, the second gas buffering member 123 is disposed inside the first gas buffering member 121, and is connected with one lateral surface of the body 110 so as to cover one side of each of the plurality of gas passages 111. For example, the second gas buffering member 123 may be formed in a case shape whose inner lateral surface facing toward the plurality of gas passages 111 is opened so as to include the second gas buffering space (GBS2) surrounded by an outer lateral surface and each lateral sidewall.

According to one embodiment of the present invention, a size of the second gas buffering space (GBS2) may be the same as a size of the first gas buffering space (GBS1).

According to another embodiment of the present invention, a size of the second gas buffering space (GBS) may be relatively smaller than a size of the first gas buffering space (GBS1) since the processing gas firstly buffered in the first gas buffering space (GBS1) is secondly buffered in the second gas buffering space (GBS2). In this case, it is possible to decrease a width of the first gas injection module 120a.

A plurality of communication holes 123h are provided at fixed intervals in the outer lateral surface of the second gas buffering member 123, that is, a confronting surface which confronts the outer lateral surface of the first gas buffering member 121, and are communicated with the first gas buffering space (GBS1). Herein, the plurality of communication holes 123h form the passage of the processing gas, which is buffered and diffused in the first gas buffering space (GBS1), to the second gas buffering space (GBS2). Through the plurality of communication holes 123h, the processing gas whose pressure is lowered by the first diffusion in the first gas buffering space (GBS1) is distributed at a constant pressure toward the second gas buffering space (GBS2), whereby the firstly-diffused processing gas is secondly diffused in the second gas buffering space (GBS2) with smoothness.

The plurality of communication holes 123h according to one embodiment of the present invention may be provided at fixed intervals in the outer lateral surface of the second gas buffering member 123, wherein the plurality of the communication holes 123h may have the same diameter (or size).

Figure 5:
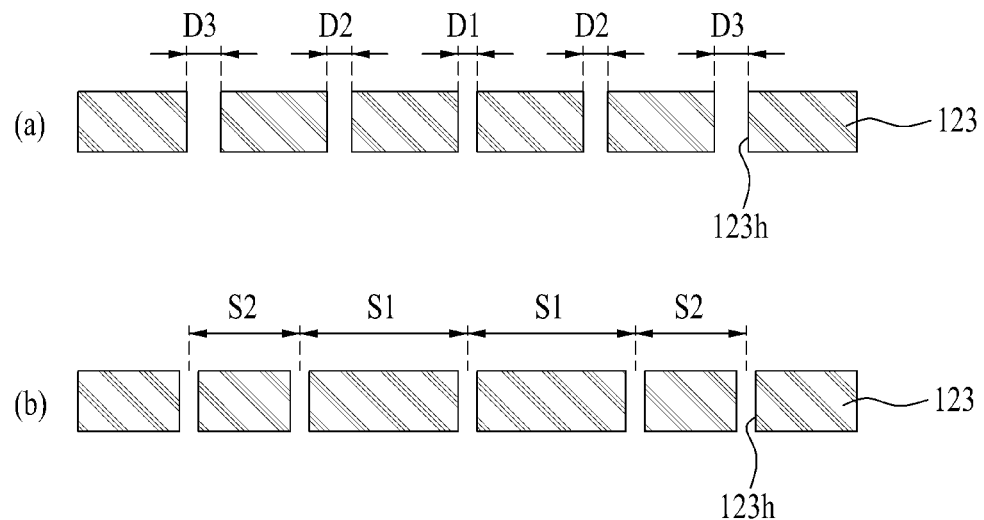
FIG. 5 is a cross sectional view for explaining a plurality of communication holes shown in FIG. 4.

As shown in (a) of FIG. 5, in consideration of a flow distance of the processing gas, a diameter (D1, D2, D3) of each of the plurality of communication holes 123h according to another embodiment of the present invention may be gradually increased from the center of the second gas buffering member 123 toward both ends of the second gas buffering member 123 with respect to the outer lateral surface of the second gas buffering member 123 (or both ends of the body 110 with respect to a longitudinal direction of one lateral surface of the body 110). In this case, the processing gas supplied from the first gas buffering space (GBS1) to the second gas buffering space (GBS2) may be buffered or diffused more uniformly.

As shown in (b) of FIG. 5, in consideration of a flow distance of the processing gas, each of the plurality of communication holes 123h according to another embodiment of the present invention may have the same diameter, and an interval (S1, S2) between the center of each of the neighboring communication holes 123h may be gradually decreased from the center of the second gas buffering member 123 toward both ends of the second gas buffering member 123 with respect to the outer lateral surface of the second gas buffering member 123. In this case, the processing gas supplied from the first gas buffering space (GBS1) to the second gas buffering space (GBS2) may be buffered or diffused more uniformly. Additionally, although not shown, in consideration of a flow distance of the processing gas, the diameter (D1, D2, D3) of each of the plurality of communication holes 123h may be gradually increased from the center of the second gas buffering member 123 toward both ends of the second gas buffering member 123 with respect to the outer lateral surface of the second gas buffering member 123, and the interval (S1, S2) between the center of each of the neighboring communication holes 123h may be gradually decreased from the center of the second gas buffering member 123 toward both ends of the second gas buffering member 123 with respect to the outer lateral surface of the second gas buffering member 123.

Referring once again to FIGS. 2 to 4, the second gas injection module 120b is connected with the other lateral surface of the body 110 in the opposite side of one lateral surface of the body 110, whereby the processing gas supplied through at least one of second gas supply pipe 130b is injected into each of the plurality of gas passages 111 by the second gas injection module 120b. The second gas injection module 120b according to one embodiment of the present invention may include a first gas buffering space (GBS1) for firstly buffering the processing gas supplied from the second gas supply pipe 130b, and a second gas buffering space (GBS2) for secondly buffering the processing gas supplied from the first gas buffering space (GBS1) and injecting the buffered processing gas into the plurality of gas passages 111. For example, the first gas injection module 120a may include the first gas buffering member 121 with the first gas buffering space (GBS1), and the second gas buffering member 123 with the second gas buffering space (GBS2). Except that the processing gas supplied from the second gas supply pipe 130b is injected into the other side of each of the plurality of gas passages 111, the second gas injection module 120b is identical in structure to the first gas injection module 120a, whereby the same reference numbers will be used throughout the drawings to refer to the same or like parts, and a detailed description for the same parts will be omitted.

Figure 6:
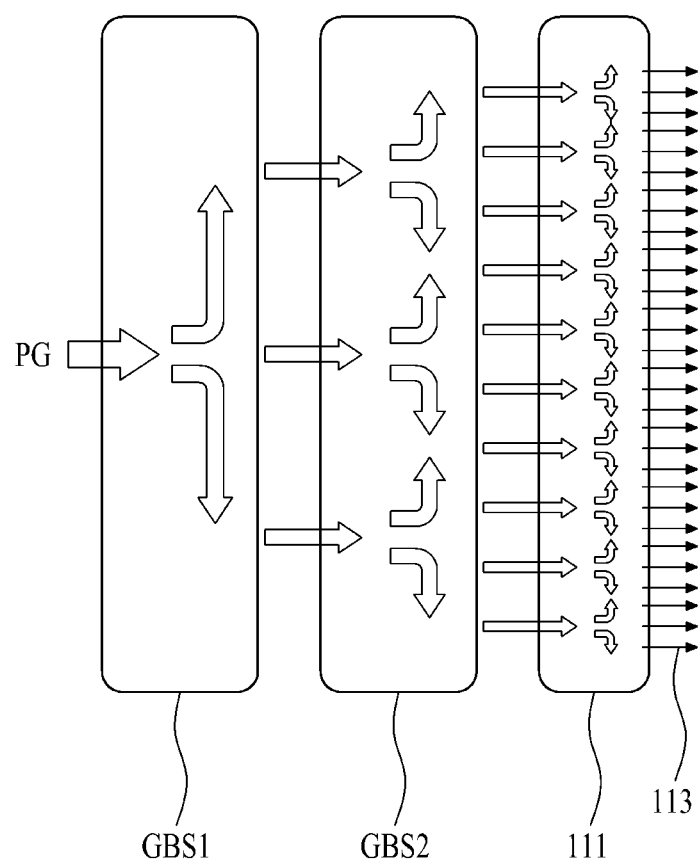
FIG. 6 illustrates a flow of processing gas in the apparatus for distributing gas according to the first embodiment of the present invention.

FIG. 6 illustrates a flow of the processing gas in the gas distribution apparatus according to the first embodiment of the present invention.

Referring to FIG. 6 in connection with FIG. 4, in case of the gas distribution apparatus according to the first embodiment of the present invention, the processing gas (PG) supplied through the first and second gas supply pipes 130a and 130b is firstly buffered and diffused in the first gas buffering space (GBS1) of the first and second gas injection modules 120a and 120b, and then the firstly-buffered processing gas is supplied to the second gas buffering space (GBS2) via the communication hole 123h of the first and second gas injection modules 120a and 120b, secondly buffered and diffused in the second gas buffering space (GBS2), and then injected into the plurality of gas passages 111. Then, the processing gas injected into the plurality of gas passages 111 is thirdly buffered and diffused in the plurality of gas passages 111, and is then downwardly distributed through the plurality of gas distribution holes 113.

In the aforementioned description, the processing gas is buffered in each of the first and second gas injection modules 120a and 120b, and is injected into both sides of each of the plurality of gas passages 111, to thereby realize the uniform injection of the processing gas into the plurality of gas passages 111 with smoothness, but not limited to this structure. It is possible to omit the second gas injection module 120b. In this case, the other end of each of the plurality of gas passages 111 is not permanently sealed by welding, but closed by the use of detachable sealing cap for a easy cleaning process.

In the gas distribution apparatus according to the first embodiment of the present invention, the gas injection modules 120a and 120b are detachably connected with one lateral surface and the other lateral surface of the body 110 provided with the plurality of gas passages 111 and the plurality of gas distribution holes 113, and the processing gas is injected into the plurality of gas passages 111 being in communication with the plurality of gas distribution holes 113 through the first and second buffering processes in the gas injection modules 120a and 120b, whereby it is possible to uniformly inject the processing gas into the plurality of gas passages 111, and to easily clean the plurality of gas passages 111 and the plurality of gas distribution holes 113 through the detachment of the gas injection modules 120a and 120b.

Figure 7:
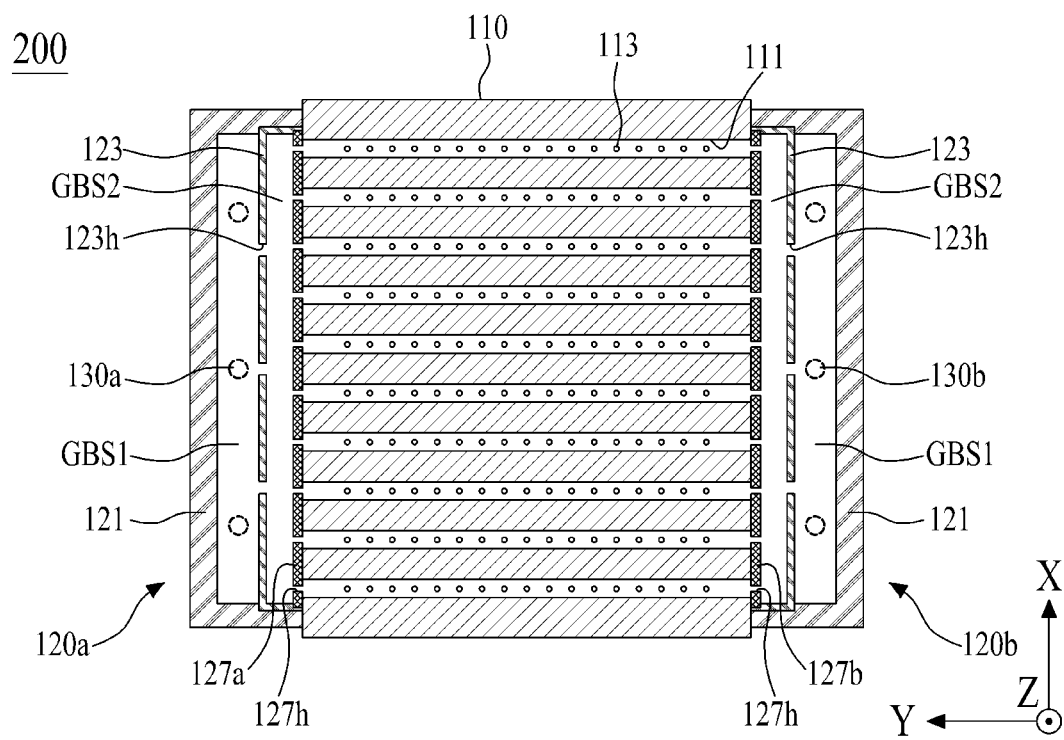
FIG. 7 illustrates an apparatus for distributing gas according to the second embodiment of the present invention.

FIG. 7 illustrates a gas distribution apparatus according to the second embodiment of the present invention. Except that a gas injection member is additionally provided in each of first and second gas injection modules shown in FIG. 4, the gas distribution apparatus according to the second embodiment of the present invention is identical in structure to the gas distribution apparatus according to the first embodiment of the present invention. Hereinafter, only the gas injection member will be described in detail.

First, a first gas injection member 127a of a first gas injection module 120a injects (or distributes) processing gas which is secondly buffered and diffused in a second gas buffering space (GBS2) into one side of each of a plurality of gas passages 111 at a constant pressure. To this end, the first gas injection member 127a is formed in a plate shape with a constant thickness, and is then connected with one lateral surface of a body 111 for covering one side of each of the plurality of gas passages 111. A plurality of gas injection holes 127h are provided in the first gas injection member 127a, and the plurality of gas injection holes 127h are respectively overlapped with the plurality of gas passages 111 in one-to-one correspondence, whereby the processing gas secondly buffered in the second gas buffering space (GBS2) is injected at a constant pressure into one side of each of the plurality of gas passages 111.

Each of the plurality of gas injection holes 127h may has a diameter and/or a cross sectional shape for increasing a pressure of the processing gas injected into the plurality of gas passages 111 in the second gas buffering space (GBS2). For example, a diameter in each of the plurality of gas injection holes 127h may be relatively smaller than a diameter in each of the plurality of gas passages 111.

Figure 8:
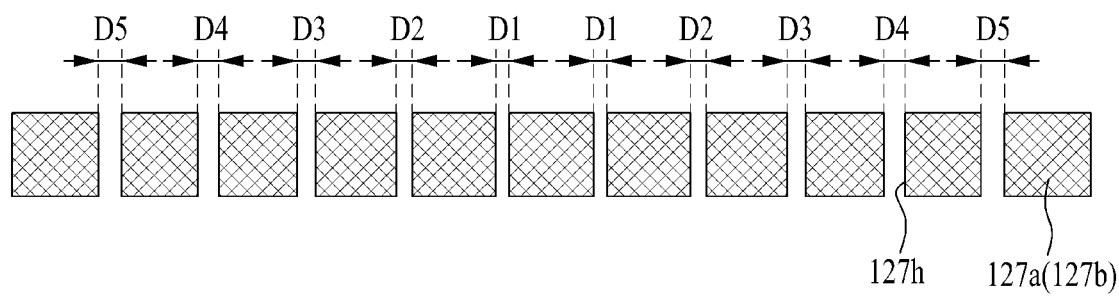
FIG. 8 is a cross sectional view for explaining a gas injection hole shown in FIG. 7.

Additionally, in consideration of a flow of the processing gas secondly buffered in the second gas buffering space (GBS2), a diameter (or size, D1 to D5) of each of the plurality of gas injection holes 127h may be gradually increased from the center of the body 110 toward both ends of the body 110 with respect to a longitudinal direction of one lateral surface of the body 110, whereby the processing gas may be uniformly injected into each of the plurality of gas passages 111, as shown in FIG. 8.

Preferably, a sealing member (not shown) is provided between the first gas injection member 127a and one lateral surface of the body 110 except the periphery of one side of each of the plurality of gas passages 111 and the periphery of the plurality of gas injection holes 127h.

A second gas injection member 127b of a second gas injection module 120b injects (or distributes) the processing gas which is secondly buffered and diffused in the second gas buffering space (GBS2) into the other side of each of the plurality of gas passages 111 at a constant pressure. To this end, the second gas injection member 127b is formed in a plate shape with a constant thickness, and is then connected with the other lateral surface of the body 111 for covering the other side of each of the plurality of gas passages 111. A plurality of gas injection holes 127h are provided in the second gas injection member 127b, and the plurality of gas injection holes 127h are respectively overlapped with the plurality of gas passages 111 in one-to-one correspondence, whereby the processing gas secondly buffered in the second gas buffering space (GBS2) is injected at a constant pressure into the other side of each of the plurality of gas passages 111. Each of the plurality of gas injection holes 127h provided in the second gas injection module 120b is identical in structure to that of the first gas injection module 120a, whereby the same reference numbers will be used throughout the drawings to refer to the same or like parts, and a detailed description for the same parts will be omitted.

Preferably, a sealing member (not shown) is provided between the second gas injection member 127b and the other lateral surface of the body 110 except the periphery of the other side of each of the plurality of gas passages 111 and the periphery of the plurality of gas injection holes 127h.

Figure 9:
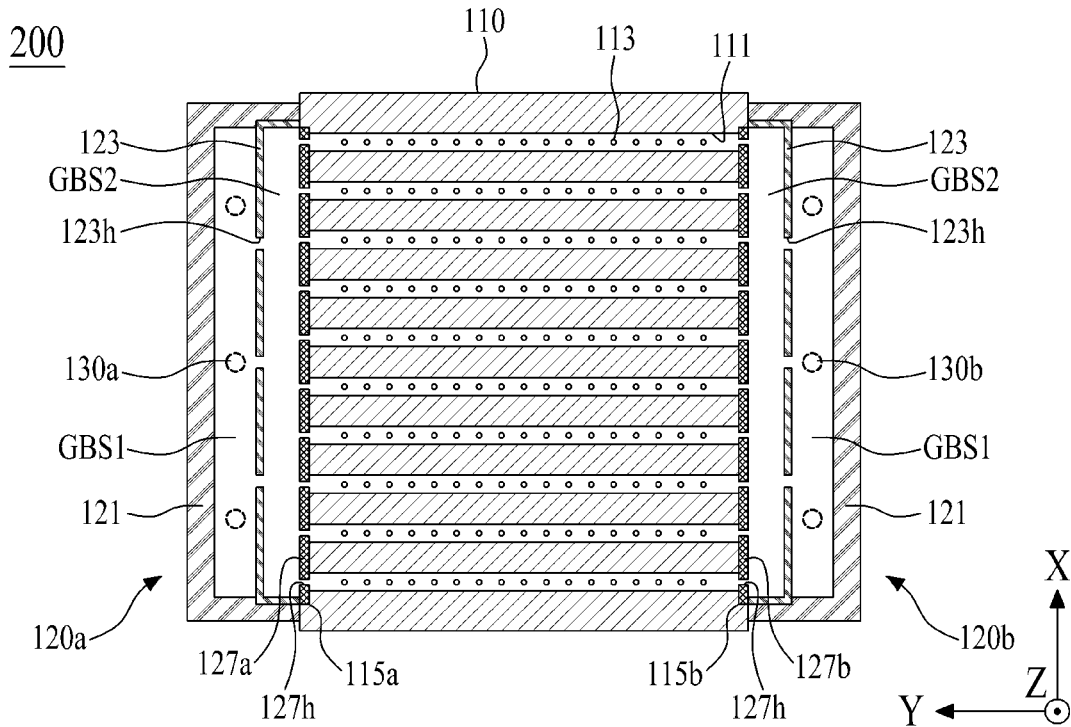
FIG. 9 illustrates a modified example of the apparatus for distributing gas according to the second embodiment of the present invention.

Meanwhile, as shown in FIG. 9, the aforementioned first gas injection member 127a may be inserted into and connected with a first insertion groove 115a which is provided at a predetermined depth in one lateral surface of the body 110. In this case, the first gas injection member 127a is not protruding out of one lateral surface of the body 110, preferably. In the same manner, the second gas injection member 127b may be inserted into and connected with a second insertion groove 115b which is provided at a predetermined depth in the other lateral surface of the body 110. In this case, the second gas injection member 127b is not protruding out of the other lateral surface of the body 110, preferably. Accordingly, the first and second gas injection members 127a and 127b are respectively inserted into one lateral surface of the body 110 and the other lateral surface of the body 110, whereby it facilitates sealing between the body 110 and each of first and second gas buffering members 121 and 123.

The gas distribution apparatus 200 according to the second embodiment of the present invention provides the same effect as the first gas distribution apparatus according to the first embodiment of the present invention. Furthermore, the gas distribution apparatus 200 according to the second embodiment of the present invention increases the pressure of processing gas injected into each of the plurality of gas passages 111 from the second gas buffering space (GBS2), and thus to uniformly inject the processing gas into each of the plurality of gas passages 111.

Figure 10:
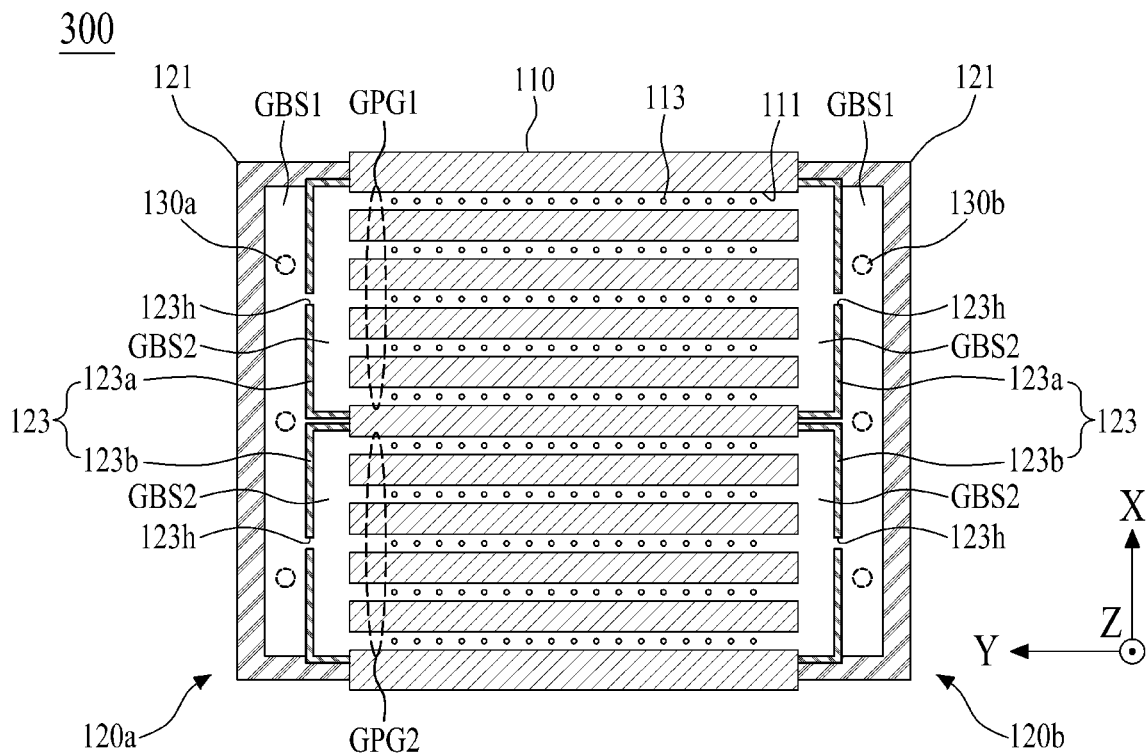
FIG. 10 illustrates an apparatus for distributing gas according to the third embodiment of the present invention.

FIG. 10 illustrates a gas distribution apparatus according to the third embodiment of the present invention. Except a structure of a second gas buffering member in each of first and second gas injection modules shown in FIGS. 1 to 4, the gas distribution apparatus according to the third embodiment of the present invention is identical in structure to the gas distribution apparatus according to the first embodiment of the present invention. Hereinafter, only the second gas buffering member will be described in detail.

First, a plurality of gas passages 111 are formed in a body 110, and a plurality of gas passage groups (GPG1, GPG2) are formed by grouping the plurality of gas passages 111, wherein each of the gas passage groups (GPG1, GPG2) includes the adjacent two or more gas passages 111. For example, if the body 110 includes the ten of gas passages 111, it is possible to form the first and second gas passage groups (GPG1, GPG2), wherein each of the first and second gas passage groups (GPG1, GPG2) includes the adjacent five gas passages 111.

A second gas buffering member 123 in each of first and second gas injection modules 120a and 120b may include a plurality of group buffering members 123a and 123b for secondly buffering processing gas supplied from a first gas buffering space (GBS1) and injecting the secondly-buffered processing gas into each of the gas passage groups (GPG1, GPG2).

Each of the plurality of group buffering members 123a and 123b may include at least one communication hole 123h and a second gas buffering space (GBS2) for secondly buffering the processing gas firstly buffered in the first gas buffering space (GBS1), and injecting the buffered processing gas into the corresponding gas passages 111 of the corresponding gas passage group (GPG1, GPG2) in common. Each of the group buffering members 123a and 123b is identical in structure to the second gas buffering member 123 shown in FIGS. 1 to 4, whereby the same reference numbers will be used throughout the drawings to refer to the same or like parts, and a detailed description for the same parts will be omitted.

The gas distribution apparatus 300 according to the third embodiment of the present invention provides the same effect as the first gas distribution apparatus according to the first embodiment of the present invention. In case of the gas distribution apparatus 300 according to the third embodiment of the present invention, the second gas buffering space (GBS2) is divided into the plurality of parts, and the processing gas is injected into the plurality of gas passages 111 through each divided part, whereby it is possible to uniformly inject the processing gas into the plurality of gas passages 111.

The gas distribution apparatus 300 according to the third embodiment of the present invention may further include a gas injection member (not shown) which is disposed in the inside of each of the group buffering members 123a and 123b, and is connected with one lateral surface of the body 110 and the other lateral surface of the body 110 corresponding to each of the plurality of gas passage groups (GPG1, GPG2). The gas injection member is identical in structure to the gas injection members 127a and 127b shown in FIGS. 8 to 10, whereby a detailed description for the structure of the gas injection member will be omitted.

Figure 11:
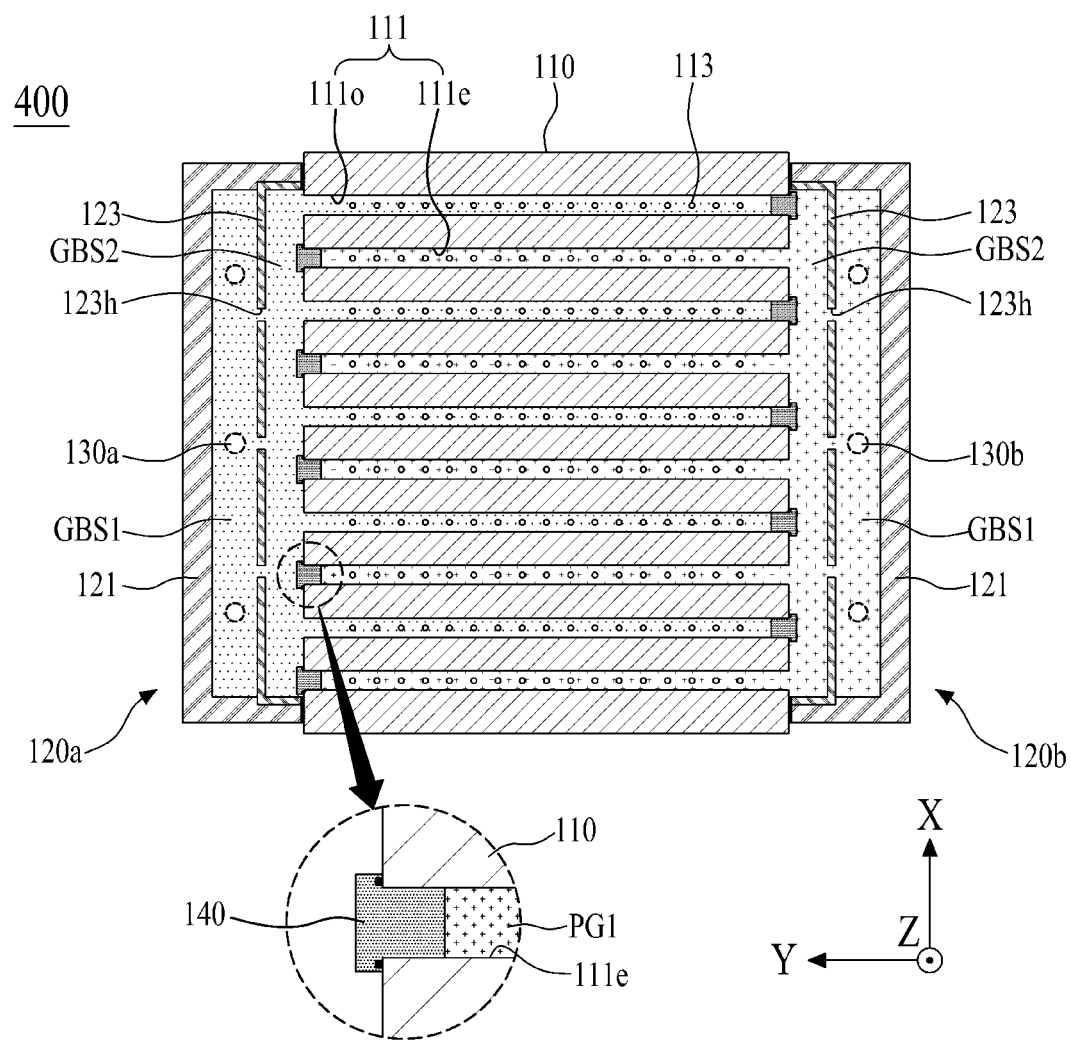
FIG. 11 illustrates an apparatus for distributing gas according to the fourth embodiment of the present invention.

FIG. 11 illustrates a gas distribution apparatus according to the fourth embodiment of the present invention, which shows a change of processing gas supplied to a plurality of gas passages shown in FIGS. 1 to 4. Hereinafter, only the plurality of gas passages and the processing gas will be described in detail.

First, a plurality of gas passages 111 are formed in a body 110. Among the plurality of gas passages 111 formed in the body 110, one side of each of some gas passages 111o, that is, the odd-numbered gas passage 111o is communicated with a second gas buffering space (GBS2) of a first gas injection module 120a, and the other side of the odd-numbered gas passage 111o is closed by a detachable sealing cap 140. Herein, first processing gas (PG1) is injected into the odd-numbered gas passage 111o through first and second buffering of the first gas injection module 120a.

Among the plurality of gas passages 111 formed in the body 110, one side of each of the remaining gas passages 111e, that is, the even-numbered gas passage 111e is closed by a detachable sealing cap 140, and the other side of each of the even-numbered gas passages 111e is communicated with a second gas buffering space (GBS2) of a second gas injection module 120b. Herein, second processing gas (PG2), which is the same as or different from the first processing gas (PG1), is injected into the even-numbered gas passage 111e through first and second buffering of the second gas injection module 120b.

In detail, a first gas injection member 127a is connected with one lateral surface of the body 110 so as to cover one side of the plurality of gas passages 111, wherein the first gas injection member 127a includes a plurality of gas injection holes 127h which are respectively overlapped with only one side of some gas passages 111o among the plurality of gas passages 111. Thus, while one side of each of some gas passages 111o is communicated with the second gas buffering space (GBS2) of the first gas injection module 120a through the plurality of gas injection holes 127*h*, one side of each of the remaining gas passages 111*e* is closed by the first gas injection member 127*a*.

Meanwhile, the second gas injection member 127*b* is connected with the other lateral surface of the body 110 so as to cover the other side of the plurality of gas passages 111, wherein the second gas injection member 127*b* includes a plurality of gas injection holes 127*h* which are respectively overlapped with only the other side of the remaining gas passages 111*e* among the plurality of gas passages 111. Thus, while the other side of each of some gas passages 111*0* is closed by the first gas injection member 127*a*, the other side of each of the remaining gas passages 111*e* is communicated with the second gas buffering space (GBS2) of the second gas injection module 120*b* through the plurality of gas injection holes 127*h*.

In the gas distribution apparatus 400 according to the fourth embodiment of the present invention, if the first processing gas and the second processing gas (PG1, PG2) are the same, the first processing gas (PG1) and the second processing gas (PG2) are respectively injected into some gas passages 111*0* and the remaining gas passages 111*e* from the opposite directions so that it is possible to uniformly inject the processing gas into the plurality of gas passages 111.

Even though the first processing gas (PG1) is different from the second processing gas (PG2) in the gas distribution apparatus 400 according to the fourth embodiment of the present invention, some gas passages 111*0* are spatially separated from the remaining gas passages 111*e* so that it is possible to prevent the first processing gas (PG1) and the second processing gas (PG2) from being mixed inside the body 110, and to uniformly distribute the first processing gas (PG1) and the second processing gas (PG2) which are different from each other.

Figure 13:
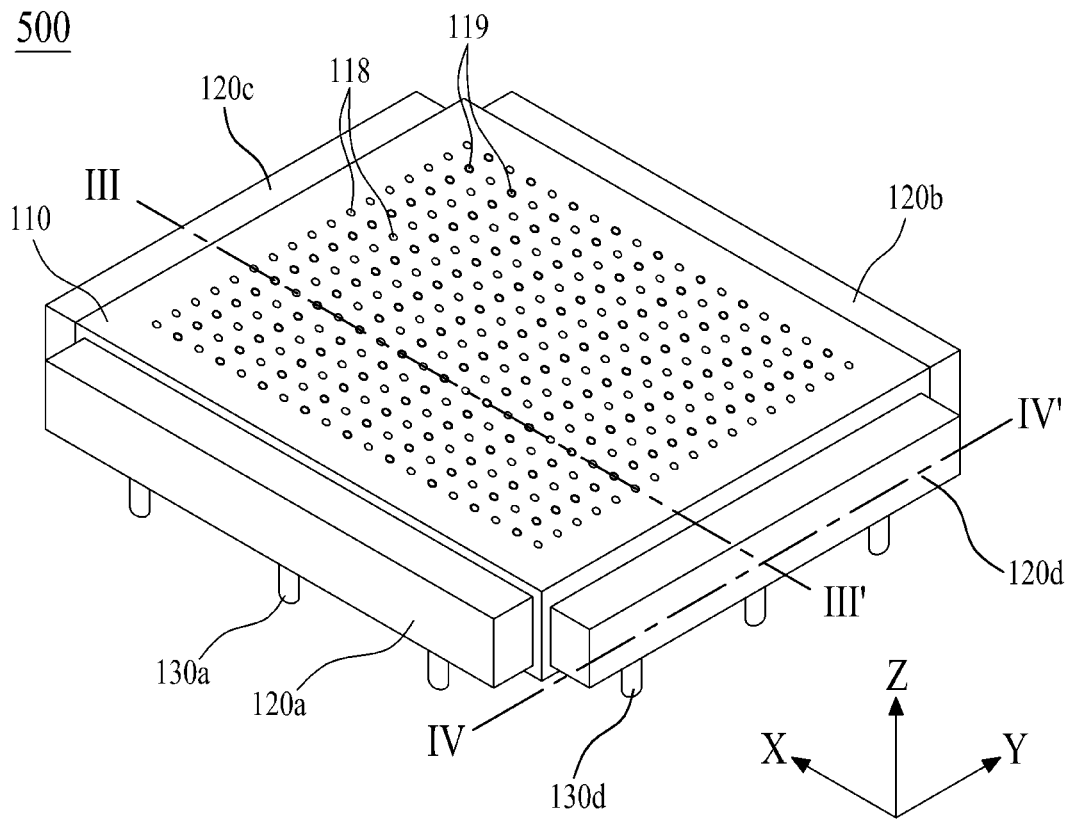
FIG. 13 is a rear perspective view illustrating an apparatus for distributing gas according to the fifth embodiment of the present invention.
Figure 14:
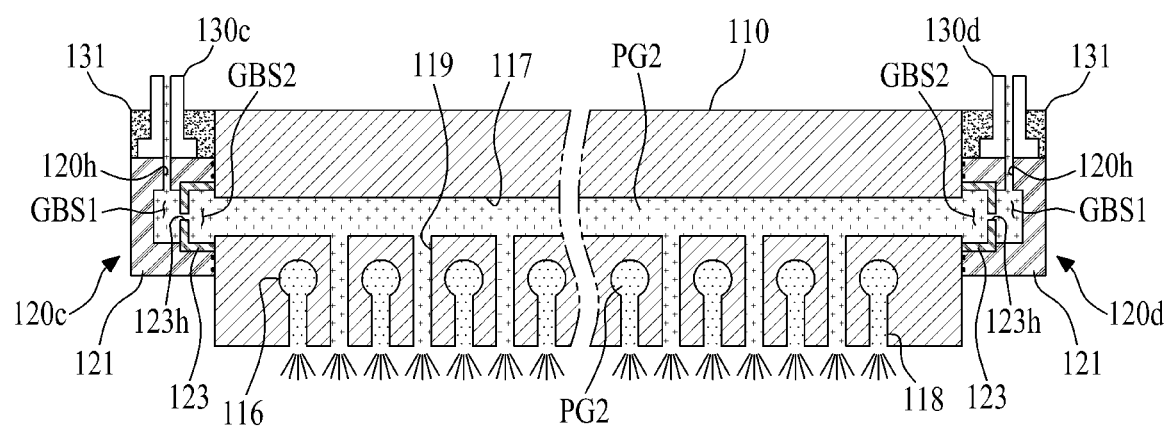
FIG. 14 is a vertical cross sectional view along of FIG. 13.
Figure 15:
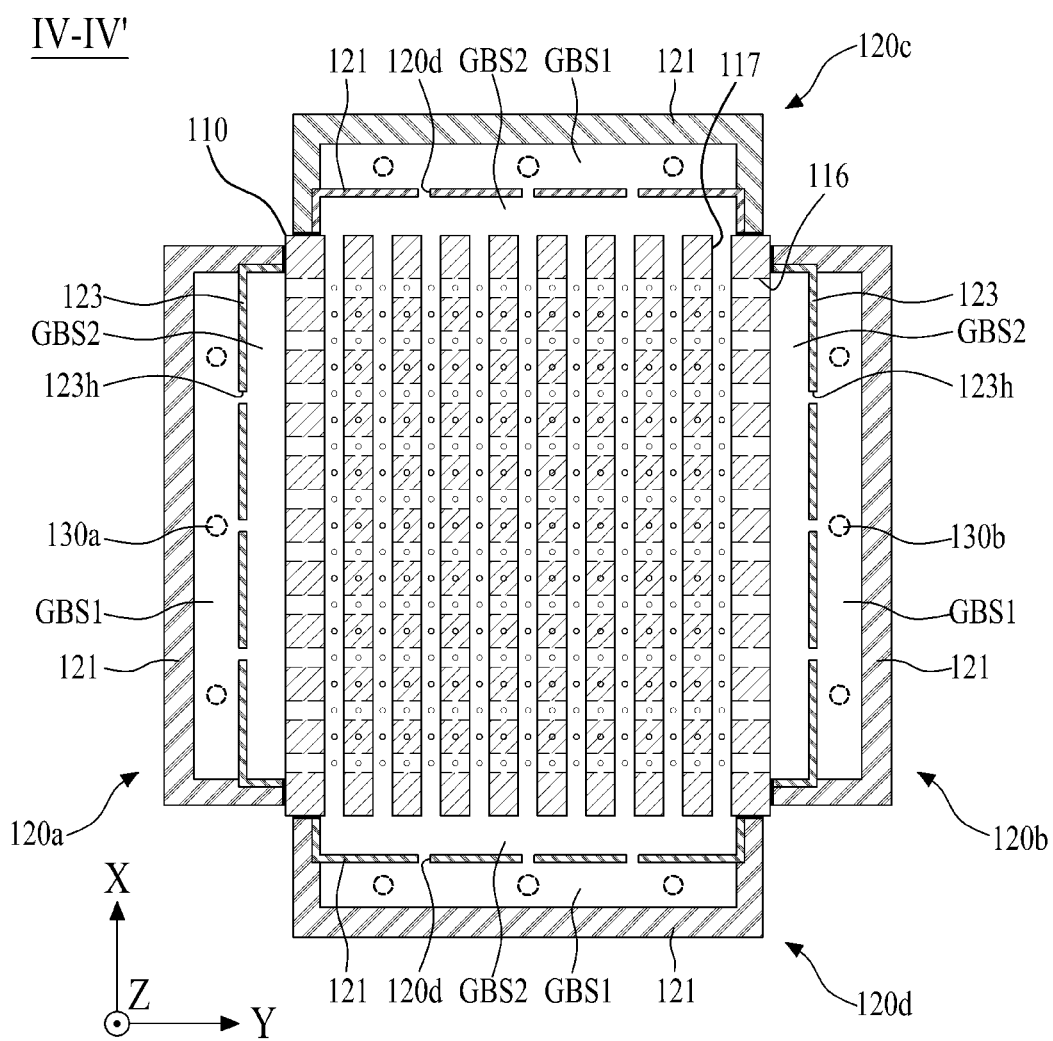
FIG. 15 is a horizontal cross sectional view along IV-IV' of FIG. 13.

FIG. 13 is a rear perspective view illustrating a gas distribution apparatus according to the fifth embodiment of the present invention. FIG. 14 is a vertical cross sectional view along of FIG. 13. FIG. 15 is a horizontal cross sectional view along IV-IV' of FIG. 13.

Referring to FIGS. 13 to 15, the gas distribution apparatus 500 according to the fifth embodiment of the present invention may include a body 110, and first to fourth gas injection modules 120*a*, 120*b*, 120*c* and 120*d*.

The body 110 may be formed of a plate-shaped metal material with a predetermined thickness, for example, aluminum or aluminum alloy. The body 110 is detachably provided in a lower surface of a chamber lid for covering an upper side of a processing chamber (not shown), whereby the body 110 confronts a substrate supporting means (not shown) provided on a bottom surface of the processing chamber.

The body 110 is provided with a plurality of first and second gas passages 116 and 117, and a plurality of first and second gas distribution holes 118 and 119.

The plurality of first gas passages 116 are provided at fixed intervals in parallel to a vertical direction (Y) inside the body 110, and the plurality of second gas passages 117 are provided at fixed intervals in parallel to a horizontal direction (X) inside the body 110, wherein each of the second gas passages 117 is disposed at a predetermined interval from each of the first gas passages 116 in a thickness direction (Z) of the body 110. In the same manner as the aforementioned first embodiment of the present invention, the plurality of first and second gas passages 116 and 117 may be formed through a gun drill working.

The plurality of first gas distribution holes 118 are vertically formed on a rear surface of the body 110 at fixed intervals. Also, the plurality of first gas distribution holes 118 are communicated with the plurality of first gas passages 116, respectively, to thereby downwardly distribute first processing gas (PG1), which is injected into the plurality of first gas passages 116, at a constant pressure. The plurality of second gas distribution holes 119 are vertically formed on the rear surface of the body 110 at fixed intervals, and are disposed to avoid the first gas passages 116. Also, the plurality of second gas distribution holes 119 are communicated with the plurality of second gas passages 117, respectively, to thereby downwardly distribute second processing gas (PG2), which is injected into the plurality of second gas passages 117, at a constant pressure. In this case, the second processing gas (PG2) may be the same as or different from the first processing gas (PG1). In the same manner as the first embodiment of the present invention, the plurality of first and second gas distribution holes 118 and 119 may include at least one distribution nozzle.

The first gas injection module 120*a* is connected with a first lateral surface of the body 110. The first gas injection module 120*a* injects the first processing gas (PG1), which is supplied through at least one of first gas supply pipe 130*a*, into one side of each of the first gas passages 116. This first gas injection module 120*a* is identical to the first gas injection module 120*a* according to the first embodiment of the present invention, whereby a detailed description for the first gas injection module 120*a* will be omitted.

The second gas injection module 120*b* is connected with a second lateral surface being opposite to the first lateral surface of the body 110. The second gas injection module 120*b* injects the first processing gas (PG1), which is supplied through at least one of second gas supply pipe 130*b*, into the other side of each of the first gas passages 116. This second gas injection module 120*b* is identical to the second gas injection module 120*b* according to the first embodiment of the present invention, whereby a detailed description for the second gas injection module 120*b* will be omitted.

The third gas injection module 120*c* is connected with a third lateral surface of the body 110. The third gas injection module 120*c* injects the second processing gas (PG2), which is supplied through at least one of third gas supply pipe 130*c*, into one side of each of the second gas passages 117. In this case, the second processing gas (PG2) may be the same as or different from the first processing gas (PG1). The third gas injection module 120*c* according to one embodiment of the present invention may include a first gas buffering space (GBS1) for firstly buffering the second processing gas supplied from the third gas supply pipe 130*c*, and a second gas buffering space (GBS2) for secondly buffering the second processing gas (PG2) supplied from the first gas buffering space (GBS1) and injecting the second processing gas (PG2) into one side of each of the plurality of second gas passages 117. For example, the third gas injection module 120*c* may include a first gas buffering member 121 with the first gas buffering space (GBS1), and a second gas buffering member 123 with the second gas buffering space (GBS2). Except that the second processing gas (PG2) supplied from the third gas supply pipe 130*c* is injected into one side of each of the plurality of second gas passages 117, the third gas injection module 120*c* is identical in structure to the aforementioned first gas injection module 120*a*, whereby a detailed description for the structure of the third gas injection module 120*c* will be omitted.

The fourth gas injection module 120*d* is connected with a fourth lateral surface being opposite to the third lateral surface of the body 110. The fourth gas injection module 120*d* injects the second processing gas (PG2), which is supplied through at least one of fourth gas supply pipe 130d, into the other side of each of the second gas passages 117. In the same manner as the third gas injection module 120c, the fourth gas injection module 120d may include a first gas buffering member 121 with a first gas buffering space (GBS1), and a second gas buffering member 123 with a second gas buffering space (GBS2). Except that the second processing gas (PG2) supplied from the fourth gas supply pipe 130d is injected into the other side of each of the plurality of second gas passages 117, the fourth gas injection module 120d is identical in structure to the aforementioned third gas injection module 120c, whereby a detailed description for the fourth gas injection module 120d will be omitted.

In the gas distribution apparatus 500 according to the fifth embodiment of the present invention, if the first processing gas and the second processing gas (PG1, PG2) are the same, the first processing gas (PG1) and the second processing gas (PG2) are respectively injected into the both sides of each of the first and second gas passages 116 and 117 intersecting each other so that it is possible to uniformly inject the processing gas into the plurality of gas passages 116 and 117.

Even though the first processing gas (PG1) is different from the second processing gas (PG2) in the gas distribution apparatus 500 according to the fifth embodiment of the present invention, the plurality of first gas passages 116 are spatially separated from the plurality of second gas passages 117 so that it is possible to prevent the first processing gas (PG1) and the second processing gas (PG2) from being mixed inside the body 110, and to uniformly distribute the first processing gas (PG1) and the second processing gas (PG2) which are different from each other.

Figure 12:
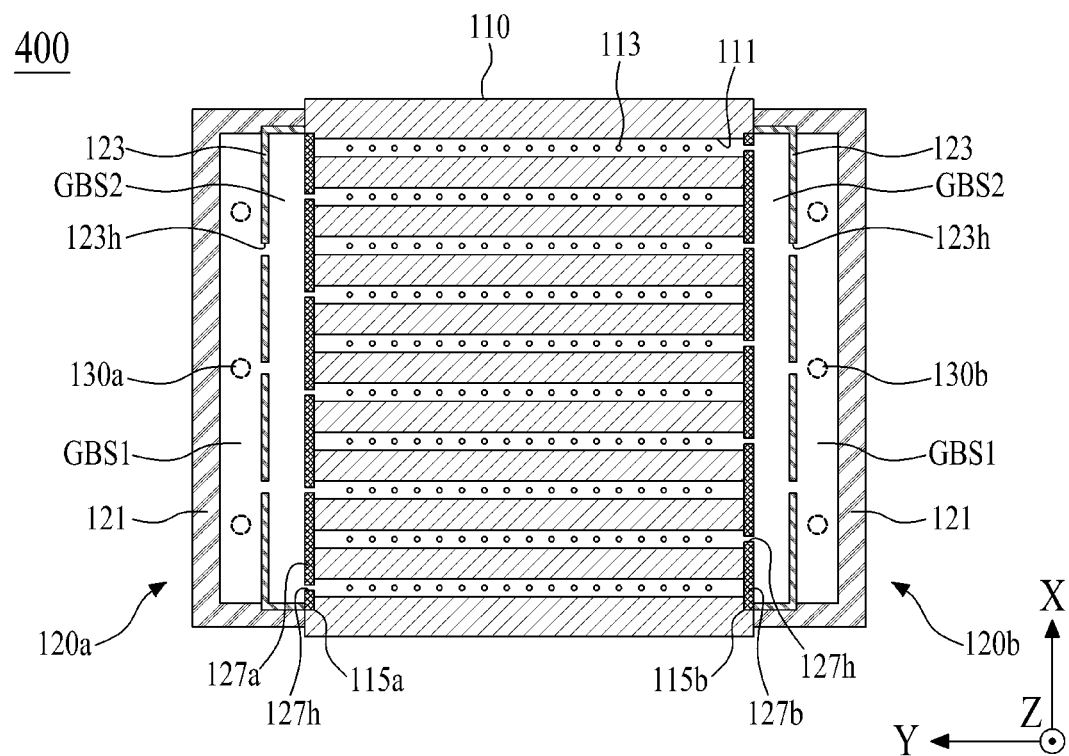
FIG. 12 illustrates a modified example of the apparatus for distributing gas according to the fourth embodiment of the present invention.

For the more uniform injection of the processing gas (PG1, PG2) into the plurality of first and second gas passages 116 and 117, the gas distribution apparatus 500 according to the fifth embodiment of the present invention may further include the structure of the gas injection member 127a and 127b shown in FIGS. 7 to 9, the structure of the plurality of group buffering members 123a and 123b shown in FIG. 10, the structure of the sealing cap 140 shown in FIG. 11, or the structure of the gas injection member 127a and 127b shown in FIG. 12, wherein the above structures may be disposed in each of the first to fourth lateral surfaces of the body 110. For example, if the gas distribution apparatus 500 according to the fifth embodiment of the present invention includes the gas injection member 127a and 127b shown in FIG. 12, the processing gas injected into the plurality of first and second gas passages 116 and 117 will be described as follows. The first processing gas (PG1) may be supplied to some of the first gas passages among the plurality of first gas passages 116 through the first gas injection member 127a, the second processing gas (PG2) may be supplied to the remaining first gas passages through the second gas injection member 127b, the third processing gas which is the same as or different from the second processing gas may be supplied to some of the second gas passages among the plurality of second gas passages 117 through the third gas injection member (not shown) which is the same as the aforementioned first gas injection member 127a, and the fourth processing gas which is the same as or different from the third processing gas may be supplied to the remaining second gas passages through the fourth gas injection member (not shown) which is the same as the aforementioned second gas injection member 127b.

Figure 16:
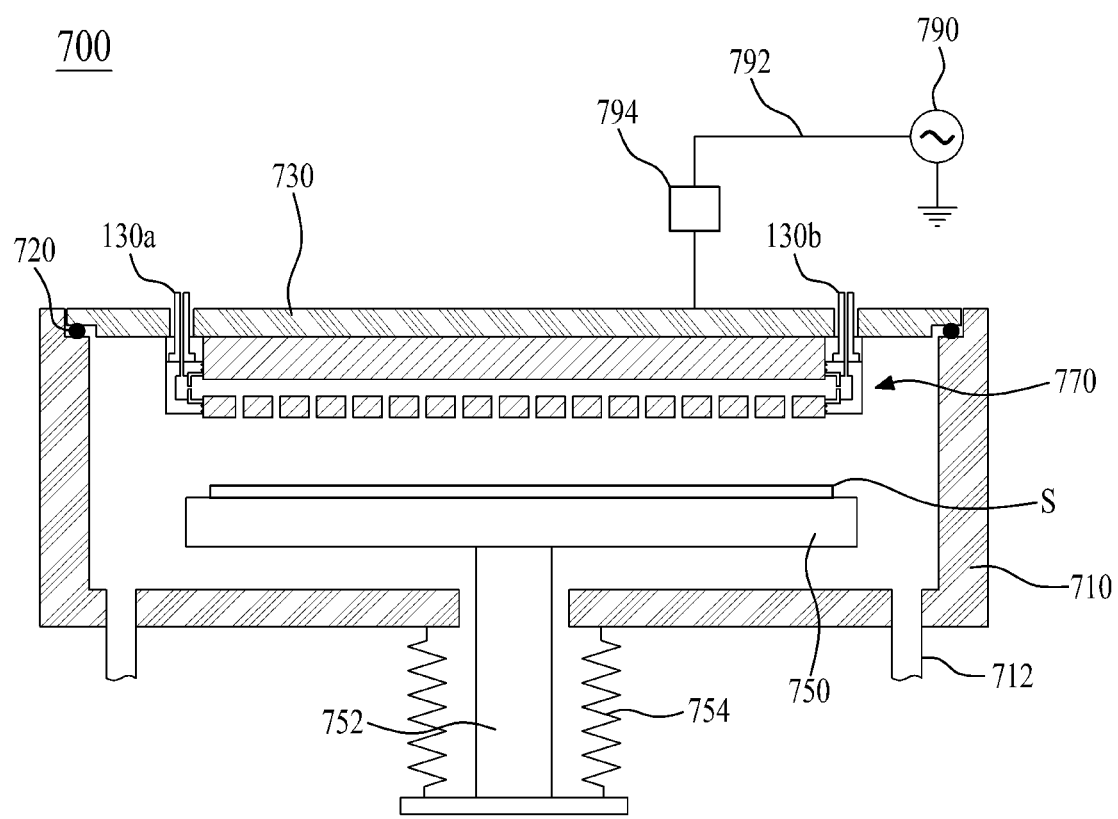
FIG. 16 is a cross sectional view illustrating an apparatus for processing substrate according to an embodiment of the present invention.

FIG. 16 is a cross sectional view illustrating an apparatus for processing substrate according to one embodiment of the present invention.

Referring to FIG. 16, the apparatus for processing substrate 700 may include a processing chamber 710, a chamber lid 730, a substrate supporting means 750, and a gas distribution means 770.

The processing chamber 710 is formed in shape of "U" whose upper side is opened. A substrate inlet (not shown), through which a substrate is loaded or unloaded, is formed at one side of the processing chamber 710, and at least one exhaust port 712 for discharging the processing gas is formed on a bottom surface of the processing chamber 710.

The chamber lid 730 is provided at an upper side of the processing chamber 710, to thereby cover the upper side of the processing chamber 710. In this case, an insulating member 720 such as O-ring is provided between a connection part between the processing chamber 710 and the chamber lid 730. The insulating member 720 seals a space between the processing chamber 710 and the chamber lid 730, and electrically separates the processing chamber 710 and the chamber lid 730 from each other.

The chamber lid 730 is connected with an external power supply means 790 via a power cable 792, and is supplied with a plasma power from the power supply means 790. In this case, an impedance matching circuit 794 may be provided in the power cable 792. The impedance matching circuit 794 may include at least two impedance devices (not shown) for matching a source impedance and a load impedance of the plasma power supplied to the chamber lid 730. The impedance device may be formed of at least one of variable capacitor and variable inductor.

The substrate supporting means 750, which is provided in the processing chamber 710, supports the substrate (S) which is loaded into a processing space by the use of substrate transferring apparatus (not shown). The substrate supporting means 750 may be movably provided in the processing chamber 710. In this case, the substrate supporting means 750 is movably provided by the use of elevating axis 752 penetrating through the bottom surface of the processing chamber 710 so that the substrate supporting means 750 is moved to a processing position or a substrate loading and unloading position by the movement of the elevating axis 752 in accordance with the driving of elevating apparatus (not shown). Herein, a space between the elevating axis 752 and the processing chamber 710 is sealed by a bellows 754.

The gas distribution means 770 confronting the substrate supporting means 750 is connected with a lower surface of the chamber lid 730. The gas distribution means 770 distributes the processing gas supplied from an external gas supply apparatus onto the substrate (S). The gas distribution means 770 may be formed of any one of the gas distribution apparatuses 100, 200, 300, 400 and 500 according to the first to fifth embodiments of the present invention shown in FIGS. 2 to 15, wherein a detailed description for the gas distribution means 770 will be omitted.

Hereinafter, a thin film deposition process using the above substrate processing apparatus 700 according to the embodiment of the present invention will be described as follows.

First, a plurality of substrates (S) or a large-sized substrate (S) may be loaded and placed onto the substrate supporting means 750.

According as the processing gas is injected into the gas injection module of the gas distribution means 770 through the gas supply pipe 130a and 130b, the injected processing gas is firstly and secondly buffered (or diffused) by the first and second gas buffering spaces of the gas injection module, and is injected into the plurality of gas passages, and then the processing gas is downwardly distributed onto the substrate (S) through the plurality of gas distribution holes. At the same time, the plasma power is applied to the chamber lid 730 through the power supply means 790, whereby the plasma power is applied to the gas distribution means 770 through the chamber lid 730. Thus, the plasma is formed between the substrate supporting means 750 and the gas distribution means 770.

Accordingly, the processing gas distributed from the gas distribution means 770 is activated by the plasma, and is distributed onto the substrate (S), to thereby deposit a predetermined thin film onto the upper surface of the substrate (S) by the activated processing gas.

In the substrate processing apparatus 700 according to the present invention, the processing gas is firstly and secondly buffered and diffused in the gas injection module connected with the body of the gas distribution means 770, and is then injected into the gas passages, whereby the processing gas is uniformly distributed onto the substrate (S), to thereby enable the uniform substrate processing. For cleaning the gas distribution means 770, both ends of each of the plurality of gas passages are exposed to the external by the detachment of the gas injection module, which is detachably provided in the body of the gas distribution means 770, so that it is possible to facilitate the cleaning of the gas passages and the gas distribution holes, and to reduce the cleaning time.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A gas distribution apparatus comprising:
a body including a plurality of gas passages connected with a plurality of gas distribution holes operative to distribute processing gas;
a first gas injection module connected with a first lateral surface of the body, wherein the first gas injection module includes first and second gas buffering spaces operative to inject first processing gas; and
a second gas injection module connected with a second lateral surface of the body opposite to the first lateral surface of the body, wherein the second gas injection module includes first and second gas buffering spaces operative to inject second processing gas, wherein the second processing gas is the same as or different from the first processing gas,
wherein,
the plurality of gas passages penetrate the first lateral surface of the body and the second lateral surface of the body,
the first gas injection module further includes a first gas injection member connected with the first lateral surface of the body so as to cover a first side of each of the plurality of gas passages,
the second gas injection module further includes a second gas injection member connected with the second lateral surface of the body so as to cover a second side of each of the plurality of gas passages,
the first gas injection member includes a plurality of gas injection holes which are respectively overlapped with only the first side of a first group of gas passages among the plurality of gas passages,
the second gas injection member includes a plurality of gas injection holes which are respectively overlapped with only the second side of a second group of gas passages among the plurality of gas passages, and
the first group of gas passages and the second group of gas passages are mutually exclusive of one another.

2. The apparatus according to claim 1, wherein,
the first gas injection member is operative to inject the first processing gas in the second gas buffering space of the first gas injection module into the first group of gas passages among the plurality of gas passages, and
the second gas injection member is operative to inject the second processing gas in the second gas buffering space of the second gas injection module into the second group of gas passages among the plurality of gas passages.

3. The apparatus according to claim 1, wherein,
the first side of each of the second group of gas passages among the plurality of gas passages is closed by the first gas injection member, and
the second side of each of first group of gas passages among the plurality of gas passages is closed by the second gas injection member.

4. A substrate processing apparatus comprising:
a processing chamber;
a chamber lid operative to cover an upper side of the processing chamber;
a substrate supporting means operative to support a substrate, the substrate supporting means provided inside the processing chamber; and
a gas distribution means confronting the substrate supporting means, the gas distribution means connected with a lower surface of the chamber lid,
wherein the gas distribution means includes an apparatus operative to distribute gas and having:
a body including a plurality of gas passages connected with a plurality of gas distribution holes for distributing processing gas;
a first gas injection module connected with a first lateral surface of the body, wherein the first gas injection module includes first and second gas buffering spaces operative to inject first processing gas; and
a second gas injection module connected with a second lateral surface of the body opposite to the first lateral surface of the body, wherein the second gas injection module includes first and second gas buffering spaces operative to inject second processing gas, wherein the second processing gas is the same as or different from the first processing gas,
wherein,
the plurality of gas passages penetrate the first lateral surface of the body and the second lateral surface of the body,
the first gas injection module further includes a first gas injection member connected with the first lateral surface of the body so as to cover a first side of each of the plurality of gas passages,
the second gas injection module further includes a second gas injection member connected with the second lateral surface of the body so as to cover a second side of each of the plurality of gas passages,
the first gas injection member includes a plurality of gas injection holes which are respectively overlapped with only the first side of a first group of gas passages among the plurality of gas passages, the second gas injection member includes a plurality of gas injection holes which are respectively overlapped with only the second side of a second group of gas passages among the plurality of gas passages, and the first group of gas passages and the second group of gas passages are mutually exclusive of one another.

5. The apparatus according to claim 4, wherein, the first gas injection member is operative to inject the first processing gas in the second gas buffering space of the first gas injection module into the first group of gas passages among the plurality of gas passages, and the second gas injection member is operative to inject the second processing gas in the second gas buffering space of the second gas injection module into the second group of gas passages among the plurality of gas passages.

6. The apparatus according to claim 4, wherein the first side of each of the second group of gas passages among the plurality of gas passages is closed by the first gas injection member, and the second side of each of the first group of gas passages among the plurality of gas passages is closed by the second gas injection member.

* * * * *